(12) United States Patent
Cano et al.

(10) Patent No.: US 6,363,516 B1
(45) Date of Patent: Mar. 26, 2002

(54) METHOD FOR HIERARCHICAL PARASITIC EXTRACTION OF A CMOS DESIGN

(75) Inventors: Francisco A. Cano, Missouri City; Nagaraj N. Savithri; Vijaya Gunturi, both of Dallas, all of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/438,808

(22) Filed: Nov. 12, 1999

(51) Int. Cl.[7] .............................................. G06F 17/50

(52) U.S. Cl. ............................... 716/5; 716/13; 716/10

(58) Field of Search ...................... 716/1–21

(56) References Cited

U.S. PATENT DOCUMENTS

| | | | | |
|---|---|---|---|---|
| 5,452,224 A | * | 9/1995 | Smith, Jr. et al. | 716/19 |
| 5,613,102 A | * | 3/1997 | Chiang et al. | 716/5 |
| 5,706,206 A | * | 1/1998 | Hammer et al. | 716/4 |
| 5,761,080 A | * | 6/1998 | DeCamp et al. | 716/5 |
| 5,831,870 A | * | 11/1998 | Folta et al. | 716/5 |
| 5,847,967 A | * | 12/1998 | Asao | 716/5 |
| 5,999,726 A | * | 12/1999 | Ho | 716/5 |
| 6,072,945 A | * | 6/2000 | Aji et al. | 716/5 |
| 6,086,238 A | * | 7/2000 | Mehrotra et al. | 716/10 |
| 6,175,947 B1 | * | 1/2001 | Ponnapalli et al. | 716/5 |
| 6,243,653 B1 | * | 6/2001 | Findley | 702/65 |

FOREIGN PATENT DOCUMENTS

| | | | | |
|---|---|---|---|---|
| JP | 410312408 A | * | 11/1998 | G06F/17/50 |

OTHER PUBLICATIONS

Overhauser et al. ("A tabular macromodeling approach to fast timing simulation including parasitics", IEEE International Conference on Computer–Aided Design, Nov. 7, 1988, pp. 70–73).*

Marazzini et al. ("CIRCLE: a program for parasitic parameter extraction", Proceedings of the European Design Automation Conference, Mar. 12, 1990, pp. 387–390).*

Pham et al. ("A new numerical method for extraction of overlap capacitance in a–Si TFTs", IEEE Electron Device Letters, Jan. 1999, pp. 30–32).*

NN87091471 ("Techniques for parasitic capacitance minimization", IBM Technical Disclosure Bulletin, vol. 30, No. 4, Sep. 1987, pp. 1471–1477 (8 pages),.*

(List continued on next page.)

Primary Examiner—Matthew Smith
Assistant Examiner—Phallaka Kik
(74) Attorney, Agent, or Firm—Gerald E. Laws; W. James Brady, III; Frederick J. Telecky, Jr.

(57) ABSTRACT

In deep submicron technologies, coupling capacitance significantly dominates the total parasitic capacitance. This causes crosstalk noise to be induced on quiescent signals which could lead to catastrophic failures. A method is provided for extracting parasitic data in a hierarchical manner from a trial layout of the integrated circuit. Intracellular parasitic data representative each cell type used in the integrated circuit is extracted only once, regardless of the number of times the cell is instantiated in the integrated circuit. For each instance of each cell, a portion of intercell signal lines that are routed over that instance of the cell are cut out in cookie cutter fashion by specifying an area in the trial layout corresponding to the instance of the cell such that the portion of intercell signal lines within the area can be processed apart from the remaining portion of the intercell signal lines. Each cutout portion of the over the cell routing (OCR) is combined with the respective cell instance and OCR parasitic data is extracted with reference to the respective cell. For each cell instance, the intracellular parasitic data derived once for the cell is combined with the OCR parasitic information derived for that cell instance in order to form a coupled simulation model.

9 Claims, 5 Drawing Sheets

OTHER PUBLICATIONS

Altan Odabasioglu, Mustafa Celik and Lawrence T. Pileggi, *PRIMA: Passive–Reduced–Order Interconnect Macromodeling Algorithm*, in Proc. of ICCAD '97, pp. 58–65, Jan. 1997.

D.A. Kirpatrick and Alberto Vincentelli, *Digital Sensitivity Predicting Signal Interaction Using Functional Analysis* Proc. of ICCAD '96, pp. 536–541, Jan. 1996.

Lun Ye, Foong–Charn Chang, Peter Feldmann, Rakesh Chadha, N.S. Nagaraj, *Chip–Level Verification of Parasitic Coupling Effects in Deep Sub–micron Digital Designs*, in Proc. of Date '99, pp. 658–663, Jan. 1999.

Joon–Seo Yim, Chong–Min Kyung, *Reducing Cross–Coupling Among Interconnect Wires in Deep–Submicron Datapath Design*, in Proc. of DAC '99, pp. 485–490, Jan. 1999.

T. Sakurai, *Closed Form Expressions for Interconnect Delay, Coupling and Crosstalk in VLSIs*, IEEE Trans. Electron Devices, vol. 40, No. 1, pp. 118–123, Jan. 1993.

Ashok Vittal and Malgorzata Marek–Sadowska, *Crosstalk Reduction for VLSI*, in IEEE Trans. on CAD, Mar. 1997, pp. 290–298, vol. 16, No. 3.

* cited by examiner

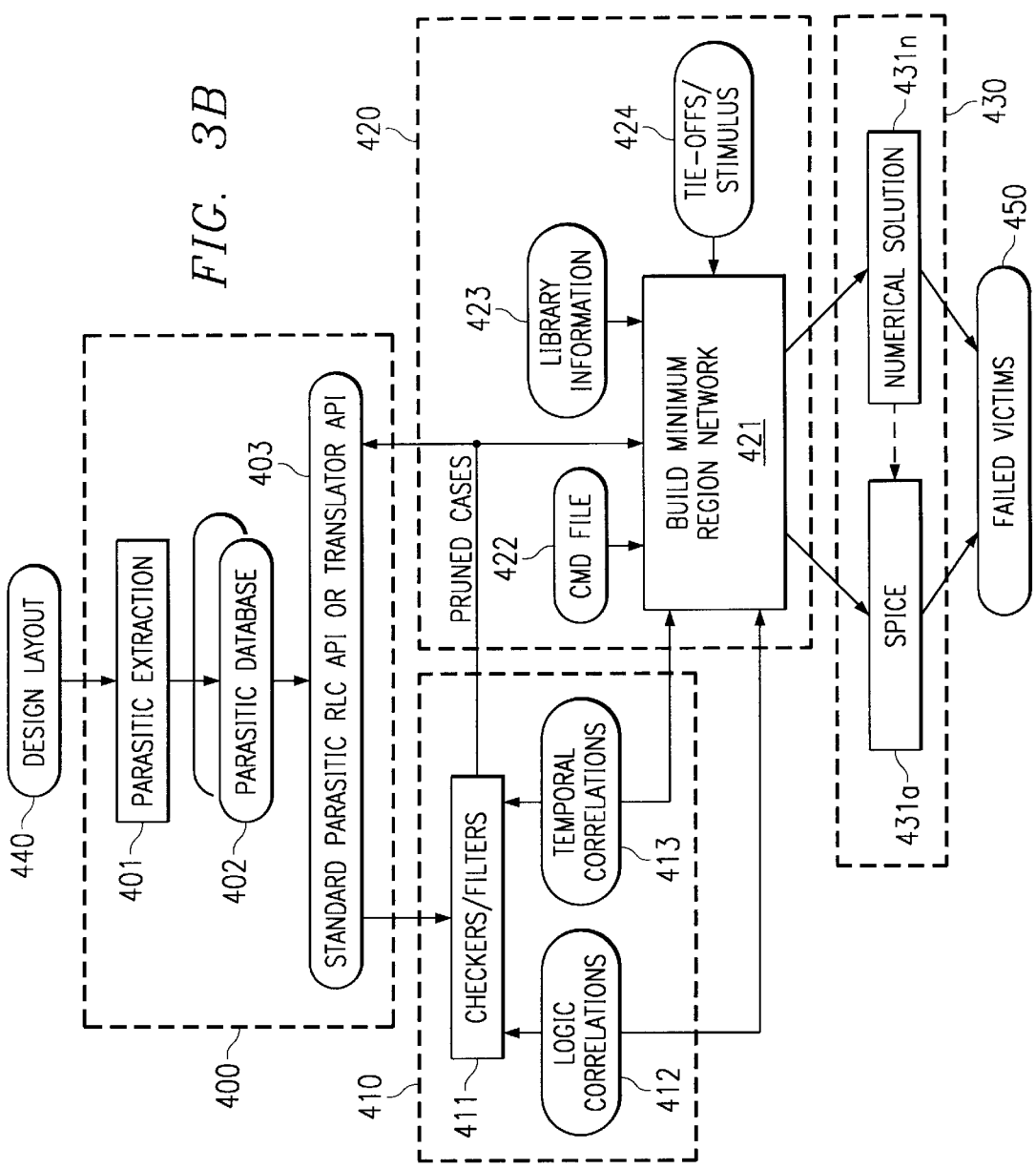
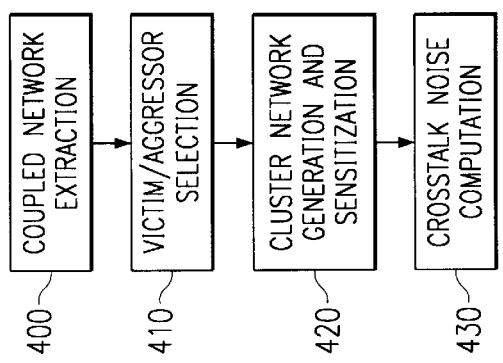

METHOD FOR HIERARCHICAL PARASITIC EXTRACTION OF A CMOS DESIGN

CROSS REFERENCE TO RELATED APPLICATIONS

This application is related to co-assigned application Ser. No. 09/608,309 filed contemporaneously herewith and incorporated herein by reference.

TECHNICAL FIELD OF THE INVENTION

This invention relates to methods for designing and fabricating digital circuits, and in particular to extract parasitic parameters for simulation and analysis of the circuit design in order to detect and eliminate crosstalk induced by capacitive coupling.

BACKGROUND OF THE INVENTION

Before an integrated circuit is fabricated, a trial design is first analyzed by simulating the operation of the proposed circuits that are to be included within the integrated circuit. Simulation is used to verify correct functional operation of the circuit, as well as to verify correct dynamic timing operation. When two signal lines on an integrated circuit are physically adjacent there is a capacitance between the signal lines that may cause signal interference due to signal coupling.

Signal integrity is one of the key challenges in design and test, now and beyond 100 nm technologies. Rapid technology scaling is causing increased coupling capacitances due to reduced signal to signal spacing and increased distance from the substrate. Among several types of noise, crosstalk noise introduced due to parasitic coupling is predominant in digital designs. Interconnect parasitic coupling has two effects, at least. A first effect is on the delay due to different switching patterns and this affects the performance of the chip besides potential race conditions. A second effect is induced glitches or noise that could cause functional failure by switching logic-states. In the case of designs employing dynamic logic design styles, this problem is more severe due to increased noise sensitivities of pre-charged nodes. In the case of static logic, except for asynchronous signals such as preset/clear and clock nodes, a failure could result when data inputs connected to storage elements are latched during the active phase of the clock.

Design complexities are increasing with system on chip (SOC) designs and increased length of interconnect at full-chip level is one of the major sources of crosstalk noise problem. This refers to integration of system level functions, for example, many functions in a cellular telephone integrated into one integrated circuit (IC). Typically, SOC designs have CPU cores, memory blocks, logic blocks and possibly analog design blocks, all on one chip. Dynamic simulation of large designs with millions of parasitics is computationally prohibitive; in order reduce computational loads, static noise verification is used. Magnitude of the parasitic coupling, behavior of victim drivers during noise injection and dependency between factors like timing and parasitic coupling are some of key challenges in noise verification.

A commonly used simulator for designing integrated circuits is SPICE, which is available from the University of California at Berkeley, via the Department of Electrical Engineering and Computer Sciences. However, a SPICE simulation of all the nets in an entire chip is far too complex to be practical.

In order to perform a SPICE simulation of a circuit, all of the nodes between every component in the circuit need to be numbered. Then those nodes, the type of components at each node, and the component magnitudes are entered into the SPICE program.

If the circuit which is being simulated is an entire integrated circuit chip, then the number of nodes and corresponding components which need to be entered into the SPICE program is overwhelming. Firstly, the number of nets may range from several thousands to a few million, in a current typical integrated circuit design. Secondly, for each such net, several thousands of discreet components need to be entered because in the actual chip, the net components are distributed. Specifically, each signal line has capacitance which is distributed throughout the line; and each signal line also has a resistance which is distributed throughout the line. To simulate these distributed components, each signal line needs to be represented by a RC network which could have several thousands of nodes; with each node having a resistor to the next node, a capacitor to ground, and capacitors to any adjacent signal lines.

After all of the nodes and corresponding components for all the nets are entered into the SPICE program, the program operates to determine the voltages which occur on each node in sequential increments of time. Typically, several thousands of increments of simulation steps are needed to obtain the entire voltage waveform on a node in one net in an integrated circuit chip. To determine the voltages for just one time increment the SPICE program repetitively solves a matrix equation which is of the form $[Y][V]=[1]$. Here, Y is an n-x-n matrix, V is an nx1 matrix, and I is an nx1 matrix; where n is the number of nodes in the circuit.

For each increment in time the SPICE program makes about two-ten iterations before it converges on a solution. This iterative process is repeated for each of the subsequent time increments.

Simplified models for crosstalk are described by Ashok Vittal and Malgorzata Marek-Sadowska in Crosstalk Reduction for VLSI, in IEEE Trans. on CAD, March 1997, for example. Reduced order modeling of parasitic networks is covered by Altan Odabasioglu, Mustafa Celik, and Lawrence T. Pileggi in PRIMA: Passive Reduced-order Interconnect Macromodeling Algorithm, in Proc. of ICCAD'97, for example. A method to account for circuit functionality during noise analysis is covered by D A Kirkpatrick and Alberto Vincentelli in Digital Sensitivity Predicting Signal Interaction Using Functional Analysis, in Proc. of ICCAD'96. A method of combining reduced order models and non-linear drivers is discussed by Lun Ye, Foong-Charn Chang, Peter Feldmann, Rakesh Chadha, Nagaraj N S in Chip-Level Verification of Parasitic Coupling Effects in Deep Sub-micron Digital Designs, in Proc. of DATE'99. Noise analysis based on noise propagation is described by Kenneth L. Shepard and Vinod Narayanan in Noise in Deep Submicron Digital Design, Tech. Dig. IEEE/ACM Int'l. Conf., Computer-Aided Design. November 1996. Methods to minimize crosstalk and crosstalk-based routing are covered by Joon-Seo Yim, Chong-Min Kyung in Reducing Cross-Coupling Among Interconnect Wires in Deep-Submicron Datapath Design, in Proc. of DAC 1999, for example.

Accordingly, a primary object of the present invention is to provide a method of designing circuit chips in which the time required to extract parasitic parameters is reduced and the accuracy is increased.

Other objects and advantages will be apparent to those of ordinary skill in the art having reference to the following figures and specification.

SUMMARY OF THE INVENTION

Extracting parasitic parameters in a hierarchical manner forms a key aspect of the methodology of the present invention. In deep submicron technologies, coupling capacitance significantly dominates the total parasitic capacitance. This causes crosstalk noise to be induced on quiescent signals that could lead to catastrophic failures. In general, and in form the present invention, a method of fabricating an integrated circuit is provided. A method is provided for extracting parasitic data in a hierarchical manner from a trial layout of the integrated circuit. Intracellular parasitic data representative of each cell type used in the integrated circuit is extracted only once, regardless of the number of times the cell is instantiated in the integrated circuit. For each instance of each cell, a portion of intercell signal lines that are routed over that instance of the cell are cut out in cookie cutter fashion by specifying an area in the trial layout corresponding to the instance of the cell such that the portion of intercell signal lines within the area can be processed apart from the remaining portion of the intercell signal lines. Each cutout portion of the over the cell routing (OCR) is combined with the respective cell instance and OCR parasitic data is extracted with reference to the respective cell. For each cell instance, the intracellular parasitic data derived once for the cell is combined with the OCR parasitic information derived for that cell instance in order to form a coupled simulation model.

In another form of the invention, the operation of the integrated circuit is simulated using the coupled simulation models to determine an amount of noise induced on intercell signal lines that are routed over the cells by intracell signal lines within the cells.

In another form of the invention, an integrated circuit is fabricated according to a modified trial layout.

In another form of the invention, a computer system is provided which has a mass storage device that holds a design program for designing an integrated circuit according to the above described method.

These and other features of the invention that will be apparent to those skilled in the art from the following detailed description of the invention, taken together with the accompanying drawings.

DESCRIPTION OF THE DRAWINGS

FIG. 3A is a conceptual flow diagram for a cross talk verification methodology which incorporates hierarchical parasitic extraction according to aspects of the present invention;

FIG. 3B is a process chart illustrating the methodology of FIG. 3A in more detail;

Corresponding numerals and symbols in the different figures and tables refer to corresponding parts unless otherwise indicated.

DETAILED DESCRIPTION OF THE INVENTION

Aspects of the present invention include methods and apparatus for designing an integrated circuit. In the following description, specific information is set forth to provide a thorough understanding of the present invention. Well-known circuits and devices are included in block diagram form in order to not to complicate the description unnecessarily. Moreover, it will be apparent to one skilled in the art that specific details of these blocks are not required in order to practice the present invention. As discussed above, interconnect parasitic coupling has two effects, at least, that are important in the design of an integrated circuit. A first effect is on the delay due to different switching patterns and this affects the performance of the chip besides potential race conditions. The second effect is induced glitches or noise that could cause functional failure by switching logic-states. Methods for improving simulation results in view of the first effect disclosed in co-assigned application Ser. No. 09/240, 993 (TI-25003), now U.S. Pat. No. 6,253,359, entitled Method for Analyzing Circuit Delays Caused by Capacitive Coupling in Digital Circuits, and is incorporated herein by reference. A method for improving simulation results in view of the second effect is described in co-assigned application Ser. No. 09/608,309 entitled A Method for Verification of Crosstalk Noise in a CMOS Design and is incorporated herein by reference. Methods described in '359 and in '309 may be advantageously combined with methods described herein.

A novel approach to parasitic parameter extraction has now been discovered which uses a hierarchical approach. Hierarchical parasitic extraction and its application to crosstalk noise verification will now be described in detail.

Figure 1:
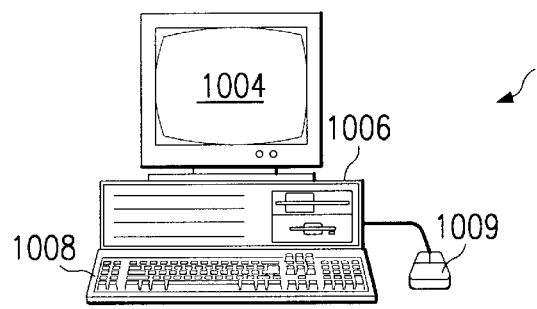
FIG. 1 is an illustration of a computer system which contains a design program for designing integrated circuits incorporating aspects of the present invention.
Figure 2:
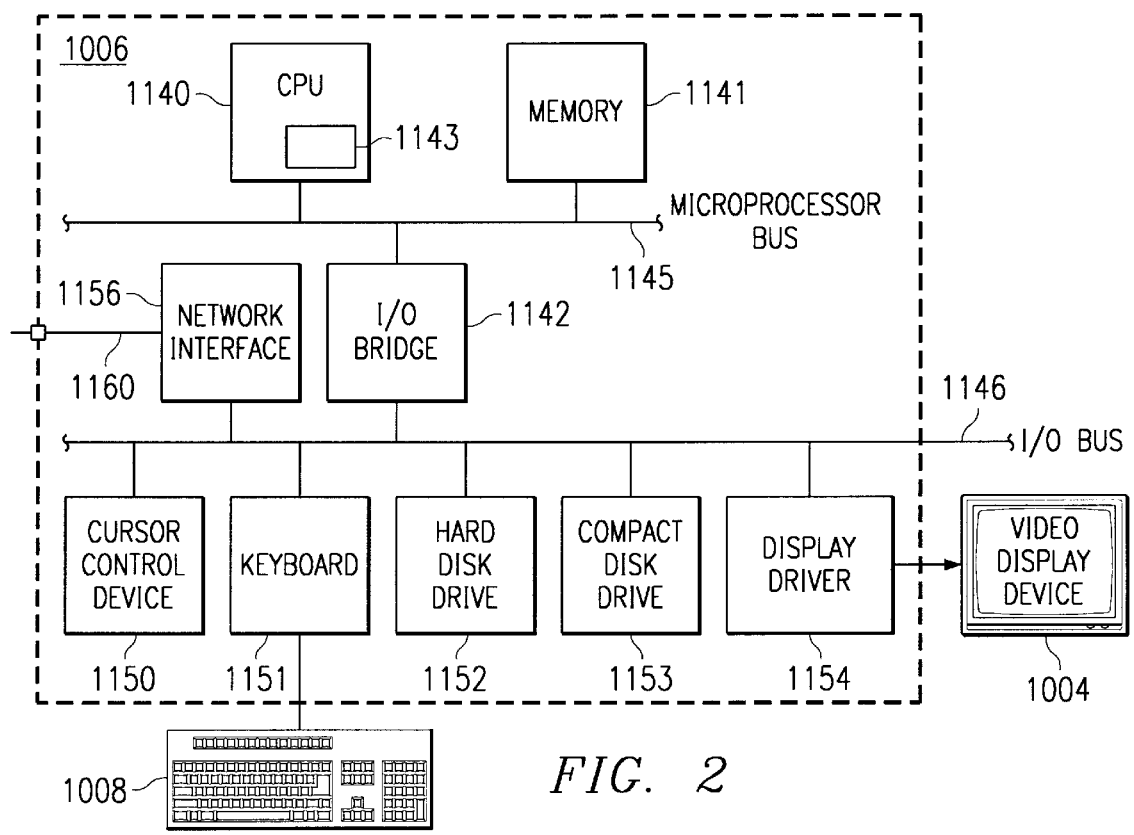
FIG. 2 is a block diagram of the computer of FIG. 1.

FIG. 1 is an illustration of a computer system 1000 which contains a design program incorporating aspects of the present invention, and FIG. 2 is a block diagram of the computer of FIG. 1. A design program that contains steps for designing an integrated circuit according to aspects of the present invention, as described in the following paragraphs, is stored on a hard drive 1152. This design program can be introduced into a computer 1000 via a compact disk installed in a compact disk drive 1153, or down loaded via network interface 1156, or by other means, such as a floppy disk or tape, for example. The program is transferred to memory 1141 and instructions which comprise the program are executed by processor 1140. Portions of the integrated circuit design are displayed on monitor 1004. The design program includes a hierarchical parasitic extraction program for extracting parasitic effects according to aspects of the present invention and a simulator for simulating the operation of the integrated circuit.

As used herein, the term "hierarchical extraction" refers to the use of multiple layout parasitic extraction runs to incrementally extract netlists and characteristics from a trial layout of an integrated circuit. Layout parasitic extraction is performed using known programs for extracting information from all or from a portion of a layout of an integrated circuit. The term "hierarchical parasitic extraction" will refer to a method that maintains parasitic integrity during incremental extraction. Table 1 defines several other terms that are used throughout this document.

TABLE 1

Definition of terms

| | |
|---|---|
| coupled | Refers to two nets with the capacitance between them modeled as a capacitor connected to the two nets of value equal to the capacitance between the nets. (also known as true C); |
| decoupled | refers to two nets with the capacitance between them modeled as two capacitors. Each capacitor has one terminal connected to GND and one terminal connected to each of the nets. The value of both capacitors is equal in value to the capacitance between the nets. The only time the values are different than the capacitance between the two nets is when coupling compensation is being performed. (also known as lump c) |
| distributed parasitics | refers to a net modeled as a network of resistors, capacitors, and/or inductors with possibly capacitance at each of the nodes in the net. |
| lumped parasitics | refers to a net or portion of a net where the resistance and inductance of the net are not modeled. In this case the capacitance would be lumped on a single node that would model a net or portion of a net. |
| net | a collection of electrically connected interconnect lines. |
| node | an electrical junction where one or more resistors/inductors are joined. Nodes may be added to a net when resistors/inductors are used to model the parasitics of the interconnect lines making up a net. |
| victim | a net that is being affected by transitions on a nearby aggressor net. |
| aggressor | a net that is affecting the operation of the victim net. |

The crosstalk verification methodology described in detail in related patent application Ser. No. 09/608,309 emphasizes pruning the total number of nets in a proposed integrated circuit design to find potential victim clusters and to analyze these clusters independently. A victim cluster is a victim and its associated aggressors. A conceptual flow diagram for this methodology is described in FIG. 3A.

Step 400, Coupled Network Extraction, involves detailed parasitic extraction of the entire design including all the coupled parasitics. Typically, this is the most time consuming portion as some form of quasi-3-D or 2.5D approach is used. Advantageously, an aspect of the present invention is to use a hierarchical approach to reduce the time required to perform extraction.

Step 410, Victim/Aggressor Selection, involves identification of potential victims and associated aggressors. Both spatial and temporal correlations are typically used in this process. This reduces the problem space and helps focus on potential problems.

Step 420, Cluster Network Generation and Sensitization, involves building a "minimum region network" which constitutes the victim, aggressors and associated R(L)C parasitics. Minimum region networks could be as simple as only the channel connected components, i.e., the source/drain connected transistors that make up the output stage of a driver, or can include complete drivers for victims/aggressors.

Step 430, Crosstalk Noise Computation, involves actual crosstalk noise computation and checking for noise propagation. This is typically done using analytical models or some form of electrical simulation. Techniques for reduced order modeling of parasitic networks is known and are helpful in reducing computation times. Failure is typically determined based on noise margins of the victim receivers and using set-up time information from timing analysis.

FIG. 3B is a process chart illustrating the methodology of FIG. 3A in more detail. A trial layout of an integrated circuit design is completed in step 440, using known layout tools. In step 400, a parasitic extraction step 401 produces a parasitic database 402, according to aspects of the present invention, that is translated for use by other simulation modules by translation step 403. Various tools for parasitic extraction are known to those skilled in the art, such as "maskPE". Parasitic extraction step 401 is based on empirical equations for parasitic capacitance. Interconnect process parameter rules for metal and dielectrics that yield maximum capacitance within specified parameter limits of the selected process are used for extraction. A hierarchical parasitic extraction method is used to account for all the interconnect interactions in various levels of interconnect hierarchy. On complex IC designs, such as digital signal processor (DSP) core, a complete coupled parasitic extraction is performed. In order to address capacity issues for full-chip verification, a two-pass parasitic extraction is used. A first pass is performed that extracts coupled line-to-line parasitic capacitances, which includes only horizontal components. A second pass is performed that extracts uncoupled parasitic capacitance and resistance, which includes both horizontal and vertical components. This is motivated by the fact that in deep sub-micron (DSM) technologies, metal lines are becoming taller and thinner which increases the lateral component of the capacitance. Typically, designs implemented in technologies below 0.5 micron are referred to as DSM designs. Currently, 0.18 u and 0.13 u are some of the leading edge technologies. Crosstalk becomes a more significant issue in DSM designs. A tabulation of capacitance data, such as Cg (Capacitance to ground), Cc (Coupling capacitance), Ctot (Total capacitance), and percentage coupling to total capacitance (PCCT) is determined for every signal and saved in a signal line database.

In step 410, filter step 411 makes use of logic correlation step 412 and temporal correlation step 413 to identify potential victim nets and associated aggressor nets. In step 420, a minimum region network is built in step 421 using command file information 422, and library information 423. Since a minimum region net is truncated from the rest of the circuitry, tie-off schemes and stimulus models are provided in step 424. In step 430, various analytical models, such as Spice 431$a$, or other reduced order modeling tools 431$n$ are used to simulate crosstalk noise and to check for noise propagation. In step 450, victim nets which are susceptible to crosstalk noise are identified based on the results of step 430. One skilled in the art will appreciate that the hierarchical parasitic extraction method described herein is not limited to use with simulation using pruning and minimum region networks; hierarchical parasitic extraction is useful when combined with almost any type of simulation approach.

Figure 4:
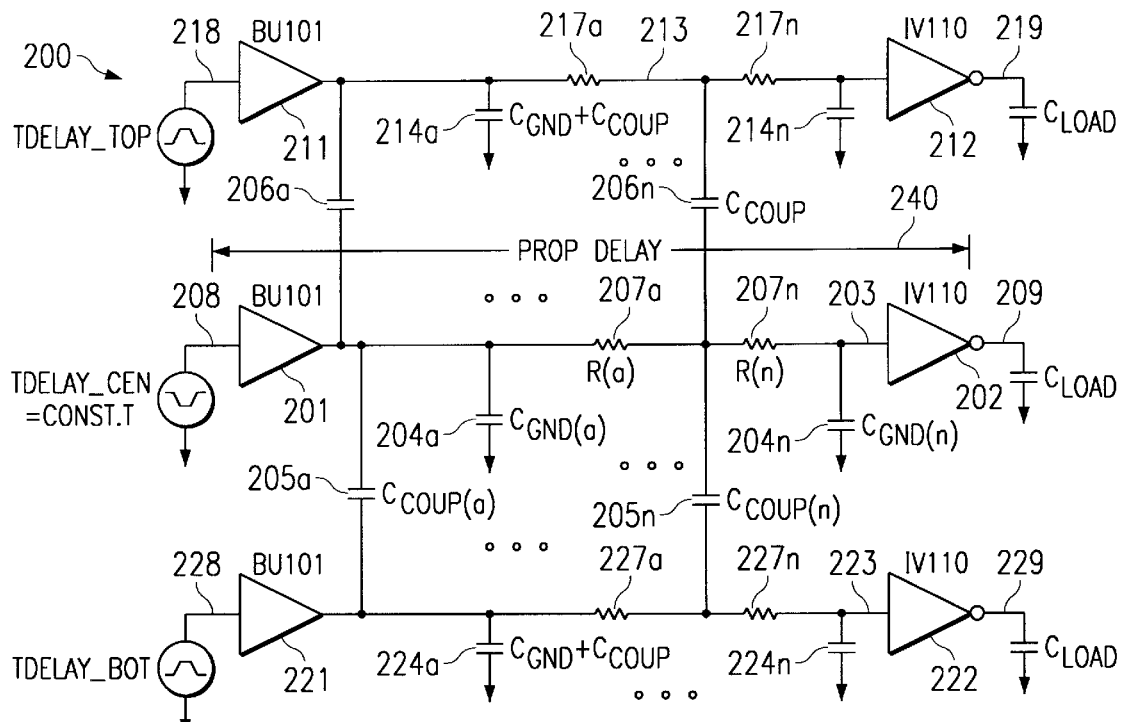
FIG. 4 is a coupled simulation model for determining propagation delay and noise induction in a signal line influenced by signal transitions on adjacent signal lines, which illustrates various parasitic components extracted during hierarchical parasitic extraction according to an aspect of the present invention.

FIG. 4 is a coupled simulation model 200 for determining propagation delay and noise induction in a signal line influenced by signal transitions on adjacent signal lines using parasitic values extracted in hierarchical parasitic extraction step 400. Simulation model 200 is a fully distributed model so that effects of signal coupling can be correctly modeled. Signal line 203 which is referred to as a "victim net" is modeled as a set of capacitors 205$a$–$n$ to ground and a set of resistors 207$a$–$n$ in series. Signal line 213 and signal line 223 represent signal lines routed adjacent to victim net 203. These are referred to as "aggressor nets." Both aggressor nets are also modeled as a set of distributed capacitors and resistors. However, the values of distributed capacitors 214a–n are scaled to account for coupling capacitance between aggressor net 213 and another signal line adjacent to it. Likewise, the values of distributed capacitors 224a–n are scaled to account for coupling capacitance between aggressor net 223 and another signal line adjacent to it.

Still referring to FIG. 4, coupling capacitance between victim net 203 and aggressor net 213 is modeled as distributed capacitors 206a–n. Likewise, coupling capacitance between victim nets 203 and aggressor nets 223 is modeled as distributed capacitors 205a–n. Coupling capacitance parameters are determined during parasitic extraction step 400 using the hierarchical approach of the present invention.

Still referring to FIG. 4, a series of SPICE simulations can be preformed in which the time at which input signals to the aggressor nets switch on lines 218 and 228 is varied with respect to the time at which an input signal to the victim net on line 208 switches to determine a worst case propagation delay 240.

Figure 5:
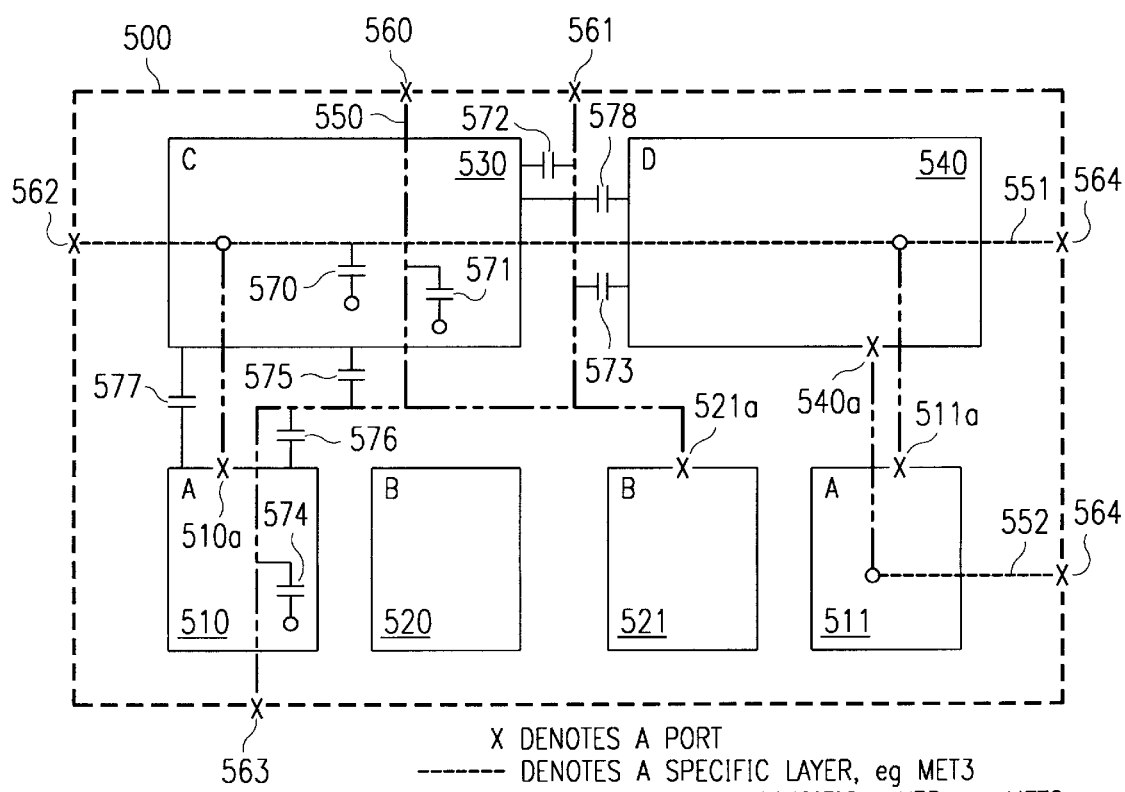
FIG. 5 is a block diagram illustrating an example module having multiple instantiations of the same cells from a cell library, which illustrates various parasitic components extracted during hierarchical parasitic extraction according to an aspect of the present invention.

FIG. 5 is a block diagram illustrating an example module 500 having multiple instantiations of the same cells from a cell library. For example, cell A is instantiated as cell 510 and also as cell 511. Likewise, cell B is instantiated as cell 520 and as cell 521. In this example, cells C and D are each instantiated once as cells 530 and 540, respectively. Each cell contains various transistors and intracell interconnecting signal lines to form a particular logic or storage function, for example. One skilled in the art will realize that FIG. 5 is only representative of an integrated circuit designed using custom and/or preformed cells of logic which are placed and then interconnected by intercell signal lines such as those illustrated by signal lines 550, 551, and 552 which connect to cell ports such as 510a, 511a, 521a, and 540a. Module 500 is representative of a module that is interconnected at signal ports 560–564 with other modules to form a complete integrated circuit. However, for purposes of explaining hierarchical parasitic extraction according to aspects of the present invention, module 500 can also represent an entire integrated circuit.

Still referring to FIG. 5, intercell signal line 550 is routed over cell 530 and has over the cell routing (OCR) parasitic capacitance to intercell signal lines within cell 530 represented by capacitor 571. Signal 550 is also routed over cell 510 and has OCR parasitic capacitance 574 to intracell signal lines within cell 510. Signal 550 is also routed between cells 530 and 510 and has additional channel parasitic capacitance 575 to intracell signal lines within cell 530 and channel parasitic capacitance 576 to intracell signal lines within cell 510. Likewise, channel parasitic capacitance 572 is formed to intracell signals within cell 530 and channel parasitic capacitance 573 is formed to intracell signals within cell 540. Additionally, intracell signals within cell 510 and intracell signals within cell 530 exhibit inter cell interaction (ICI) parasitic capacitance represented by capacitance 577. Similarly, intracell signals within cell 530 and intracell signals within cell 540 exhibit ICI parasitic capacitance represented by capacitance 578.

Similarly, intercell signal line 551 is routed over cell 530 and has OCR parasitic capacitance to intercell signal lines within cell 530 represented by capacitor 570. Likewise, various OCR and channel parasitic capacitance exists between each of the intercell signal lines and various cells, as well as ICI parasitic capacitance among the various cells. OCR, ICI and channel capacitance 570–578 are merely representative of myriad parasitic elements which exist in module 500.

Hierarchical parasitic extraction requires that parasitics not be counted a multiple number of times when extraction is done at multiple levels. For example, if the sub-circuits of a cell used for characterization includes capacitance due to signal line routing internal to a gate within the cell, there will be double counting of parasitics when parasitic extraction is is done at higher levels. In order to overcome this, routing parasitics internal to a gate are not included and separately included after extraction at higher levels. Alternatively, all parasitics are included in the extraction flow. The only modifications will be to the resulting timing models. Each pin's capacitance will be adjusted downward by the amount of the interconnect capacitance on that pin.

Figure 6:
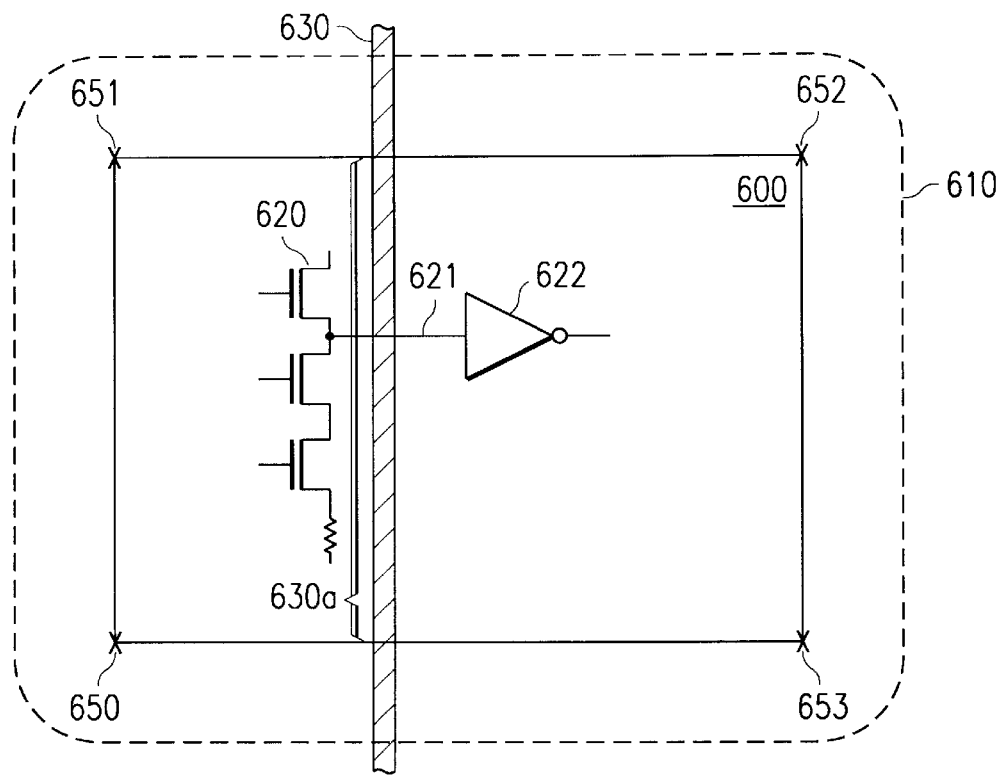
FIG. 6 is partial schematic of a representative cell illustrating how an intercell signal line can interact with intracell signal line to form OCR parasitic capacitance at the intersection of these two signals.

FIG. 6 is partial schematic of a representative cell 600 illustrating how an intercell signal line 630 can interact with intracell signal line 621 to form OCR parasitic capacitance at the intersection of these two signals. A gate within cell 600 includes transistors 620 that drive intracell signal line 621, which in turn is connected to buffer 622. Signal transitions on OCR signal line 630 can cause a signal bounce on intracell signal line 621 that could be missed during design evaluation if OCR parasitics are not accounted for correctly. In FIG. 6, OCR 630 is only representative of intercell signal lines. A given cell can have many signals routed over it that must each be accounted for. There can be multiple instantiations of a same cell. OCR and hence parasitics will be different for each instantiation. For example, cells 'A' and 'B' in FIG. 5 are instantiated twice and OCR on them is different. Thus, victim/aggressor signal interaction can occur between intracell signal lines and OCR signal lines.

As discussed above, there can also be routing between the cells, referred to as channels. These parasitics also need to be accounted for if they are within a zone of influence, indicated by dotted line 610, for a given cell.

Figure 7:
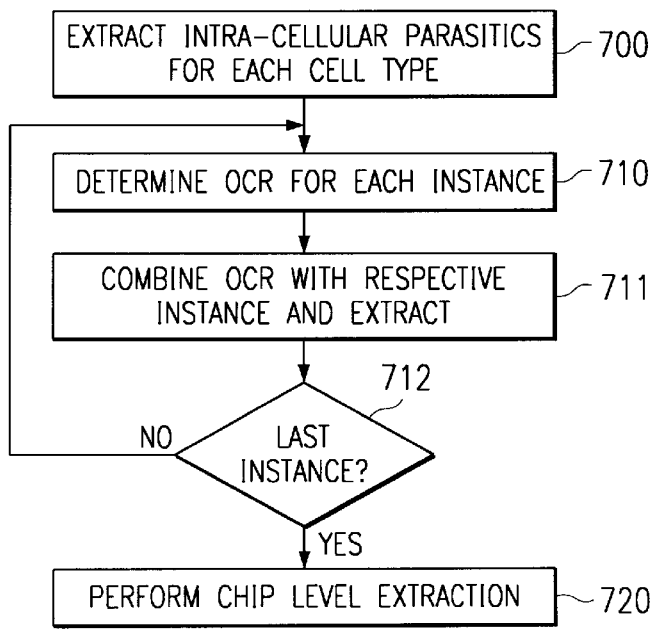
FIG. 7 is a flow diagram representing hierarchical parasitic extraction, according to aspects of the present invention.

FIG. 7 is a flow diagram representing hierarchical parasitic extraction, according to aspects of the present invention. In step 700, each cell type that is used in a design of an integrated circuit is extracted once to determine intracellular parasitic data. The intracellular parasitic extraction data is saved in an extraction database. This may be performed prior to the design layout, or it may be performed afterwards. Also, any over the cell routing that is known and will be common to all instances of the cell, such as power buses, pre-routed clock signal lines, etc, may be included in this step. Step 700 forms a first level of the hierarchical parasitic extraction process.

Still referring to FIG. 7, in step 710 a portion of the integrated circuit layout that includes only one individual instance of a cell and all of the OCR associated with it is determined by a cookie cutter approach that essentially cuts out the portion of intercell signal lines which overlay this instance of the cell. Signal names are provided to the cut out portion of OCR, using a naming convention so that later it can be deciphered, and also so that it gets into a geometrical database (GDB). The GDB is a database that holds netlist and layout connectivity information. The OCR geometries are output with these unique signal names at the boundaries. These names then become the means by which the OCR characterized at the module level is reconnected with the top cell route when a final netlist integration is performed. In step 711, the OCR determined in step 710 is combined with the respective instance and extraction is performed. Advantageously, only parasitics resulting from the OCR need be incrementally extracted, since the intracellular parasitics for the cell determined in step 700 are provided to step 711 from the extraction database. Generally, the cookie cutter used to cut out the OCR signal lines for each instance is in the form of a rectangle, but the geometry is determined based on the design of the cell. For example, referring again to FIG. 6, for cell instance 600 a cookie cutter for OCR 630 is specified by providing the coordinates of each corner 650, 651, 652 and 653. The area within this rectangle becomes a box which contains a portion 630a of OCR 630 that is extracted from the remaining portion of OCR 630. Only portion 630a is used to determine parasitic data relating to cell instance 600.

In step 712, a check is made to determine if the last instance of the entire integrated circuit has been processed. If not, steps 710 and 711 are repeated for each remaining instance. Steps 710, 711 and 712 together form a second level of the hierarchical parasitic extraction process.

In step 720, chip level extraction is performed, but only for those routings which were not earlier accounted for. In other words, this step extracts OCR in channels between the modules. The naming convention mentioned in step 710 is also used here. Step 720 forms a third level of the hierarchical parasitic extraction process. Note, this step is not necessary if there are no channels at top level, that is, if all modules are connected by abutment.

In another embodiment of the process of FIG. 7, instead of creating signal names for OCR layers, dummy pins are created for each instance box (sub-module) to provide a means by which the OCR characterized at the module level is reconnected with the top cell routing. This approach effectively creates an extra cell just for OCR and then merges it into the respective module. Inputs to the module for OCR signals are a set of geometries for the pins with dynamically generated signal names, and a group of geometries which are to form the module's contents. This is a pre-circuit interconnect so that the box can be hooked up in the GDB. After parasitic extraction, OCR parasitics are included within the module, which can then be processed to separate them out. After post-processing, there is one OCR cell for each instance in the design. Each OCR cell is connected to modules and other OCR cells to form a complete netlist.

In either embodiment discussed above, if two modules overlap the OCR common to the overlap region is characterized during the top level extract. As well, the module geometries common to the overlap region are also included in the top level characterization as secondary geometries for which no parasitics are extracted. The OCR common to the overlap region is excluded from the set of geometries, which were tagged with signals. The OCR geometries common to the overlap region would are included in each module's cutout cell but they are treated as secondary geometries.

Figure 8:
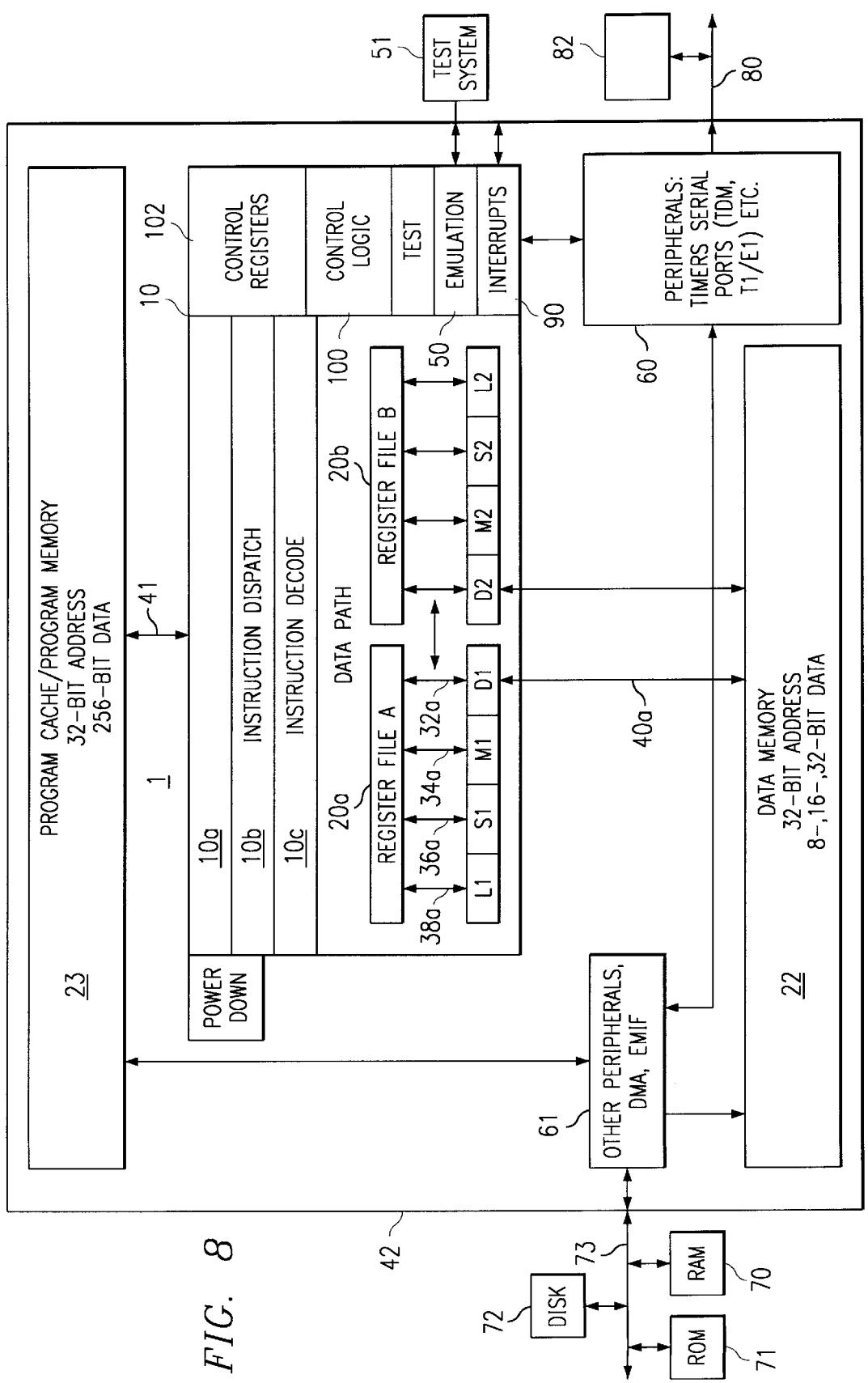
FIG. 8 is a block diagram of an integrated circuit that is designed and fabricated according to aspects of the present invention.

FIG. 8 is a block diagram of a microprocessor 1, which can be designed using aspects of the present invention. Microprocessor 1 is a VLIW digital signal processor ("DSP"). In the interest of clarity, FIG. 1 only shows those portions of microprocessor 1 that are relevant to an understanding of an embodiment of the present invention. Details of general construction for DSPs are well known, and may be found readily elsewhere. For example, U.S. Pat. No. 5,072,418 issued to Frederick Boutaud, et al, describes a DSP in detail and is incorporated herein by reference. U.S. Pat. No. 5,329,471 issued to Gary Swoboda, et al, describes in detail how to test and emulate a DSP and is incorporated herein by reference. Details of portions of microprocessor 1 relevant to an embodiment of the present invention are explained in no sufficient detail hereinbelow, so as to enable one of ordinary skill in the microprocessor art to make and use the invention.

In microprocessor 1 there are shown a central processing unit (CPU) 10, data memory 22, program memory 23, peripherals 60 and an external memory interface (EMIF) with a direct memory access (DMA) 61. CPU 10 further has an instruction fetch/decode unit 10a–c, a plurality of execution units, including an arithmetic and load/store unit D1, a multiplier M1, an ALU/shifter unit S1, an arithmetic logic unit ("ALU") L1, a shared multi-port register file 20a from which data are read and to which data are written. Decoded instructions are provided from the instruction fetch/decode unit 10a–c to the functional units D1, M1, S1, and L1 over various sets of control lines which are not shown. Data are provided to/from the register file 20a from/to to load/store units D1 over a first set of busses 32a, to multiplier M1 over a second set of busses 34a, to ALU/shifter unit S1 over a third set of busses 36a and to ALU L1 over a fourth set of busses 38a. Data are provided to/from the memory 22 from/to the load/store units D1 via a fifth set of busses 40a. Note that the entire data path described above is duplicated with register file 20b and execution units D2, M2, S2, and L2. Instructions are fetched by fetch unit 10a from instruction memory 23 over a set of busses 41. Emulation unit 50 provides access to the internal operation of integrated circuit 42 which can be controlled by an external test system 51. The various register files, memories and functional units described above are each designed as modules, wherein each module contains many submodules, several of which contain further sub-submodules.

Note that the memory 22 and memory 23 are shown in FIG. 11 to be a part of a microprocessor 1 integrated circuit, the extent of which is represented by the box 42. The memories 22–23 could just as well be external to the microprocessor 1 integrated circuit 42, or part of it could reside on the integrated circuit 42 and part of it be external to the integrated circuit 42. Also, an alternate number of execution units can be used.

When microprocessor 1 is incorporated in a data processing system, additional memory or peripherals may be connected to microprocessor 1, as illustrated in FIG. 11. For example, Random Access Memory (RAM) 70, a Read Only Memory (ROM) 71 and a Disk 72 are shown connected via an external bus 73. Bus 73 is connected to the External Memory Interface (EMIF) which is part of functional block 61 within integrated circuit 42. A Direct Memory Access (DMA) controller is also included within block 61. The DMA controller is generally used to move data between memory and peripherals within microprocessor 1 and memory and peripherals, which are external to microprocessor 1. These additional peripheral circuits which are included on the same integrated circuit 42 are also designed as individual modules.

With technology scaling, crosstalk noise has become a problem in a DSM design such as integrated circuit 42. Unlike timing problems, crosstalk noise could manifest only intermittently when certain combinations of signal switching are satisfied. Such failures could happen in the end-application as testers fail to detect them during product qualification. An aspect of the present invention advantageously provides an innovative way to extract parasitic parameters in order to perform static noise verification on integrated circuit 42 before it is fabricated. Advantageously, hierarchical parameter extraction significantly reduces the time required to extract parasitic information relating to integrated circuit 42. One skilled in the art will readily recognize that integrated circuit 42 is representative of a broad spectrum of integrated circuits that can be designed using hierarchical parameter extraction according to aspects of the present invention. Therefore, integrated circuit 42 should not be construed as limiting the present invention in any manner.

Fabrication of data processing device 1 after the design is completed and crosstalk violations have been dealt with according to aspects of the present invention, involves multiple steps of implanting various amounts of impurities into a semiconductor substrate and diffusing the impurities to selected depths within the substrate to form transistor devices. Masks are formed to control the placement of the impurities. Multiple layers of conductive material and insulative material are deposited and etched to interconnect the various devices. These steps are performed in a clean room environment.

A significant portion of the cost of producing the data processing device involves testing. While in wafer form, individual devices are biased to an operational state and probe tested for basic operational functionality. The wafer is then separated into individual dice which may be sold as bare die or packaged. After packaging, finished parts are biased into an operational state and tested for operational functionality.

Thus, a novel technique for extracting parasitic parameters using a hierarchical approach has been presented. Hierarchical parasitic extraction is necessary to perform accurate analysis at the chip level in a reasonable amount of time. Hierarchical parasitic extraction allows for chip analysis in a reasonable amount of time as smaller modules are extracted in a parallel manner, such that the task can be easily allocated across a set of processors operating in parallel.

Advantageously, accuracy of the extraction and subsequent analysis is improved since all the effects of interacting interconnect layers are taken into account.

Advantageously, hierarchical parasitic extraction according to aspects of the present invention does not double count the capacitance extracted from various layers over a cell or module and from signal lines within the cell or module.

Advantageously, hierarchical parasitic extraction according to aspects of the present invention considers OCR (Over the Cell Routing) parasitics.

Advantageously, hierarchical parasitic extraction according to aspects of the present invention considers ICI (Inter Cell Interaction) parasitics.

Advantageously, hierarchical parasitic extraction according to aspects of the present invention allows incremental extraction. That is, if a first layout is changed, then extraction can be performed on only those portions of the layout which undergoes change in order to reduce processing time.

Advantageously, hierarchical parasitic extraction according to aspects of the present invention generates a capacitance interaction matrix needed for coupling analysis.

Advantageously, hierarchical parasitic extraction allows parallelism to reduce wall clock time for a complete extraction task because different instances can be extracted on different machines at the same time.

Crosstalk noise is a transient event and is highly dependent on timing relationship between coupled signals. Depending on the timing relationship, induced noise could cause an operational failure of the IC at certain frequencies and voltages, whereas the IC could operate correctly at neighboring frequencies. This could be hard problem to detect during product qualification as testing is generally performed at discrete frequencies. Also, a complete set of test vectors used to exercise the IC may not be complete during product qualification, which could leave room for failure if crosstalk noise is not detected during the design phase itself. Hierarchical parasitic extraction advantageously allows rapid and accurate determination of parasitic parameters so that accurate simulation of a proposed design can be performed.

As used herein, the terms "applied," connected," and "connection" mean electrically connected, including where additional elements may be in the electrical connection path.

While the invention has been described with reference to illustrative embodiments, this description is not intended to be construed in a limiting sense. Various other embodiments of the invention will be apparent to persons skilled in the art upon reference to this description. For example, a sub module may itself have sub-submodules which are instantiation of one or more cells. Each sub-submodule can be treated as discussed above by combining it with its related OCR and extracting. Submodules are then treated as a chip level for extraction of channel routing between submodules and then all submodules are post-processed together at a top chip level for extract channel routing between submodules. Alternatively, sub-submodules can be first combined together to form the relevant submodule and extracted as described earlier with respect to FIG. 7.

In another embodiment in which one or more routing layers are placed underneath a layer of cells, both over the cell routing and under the cell routing can be accounted for in a hierarchical manner.

In another embodiment in which one or more layer of cells is stacked vertically on top of another layer of cells to form a three dimensional structure, both over the cell routing and under the cell routing can be accounted for in a hierarchical manner.

It is therefore contemplated that the appended claims will cover any such modifications of the embodiments as fall within the true scope and spirit of the invention.

What is claimed is:

1. A method for designing an integrated circuit which contains a plurality of signal lines in close proximity, such that capacitive coupling among the signal lines is operable to induce crosstalk on at least one of the signal lines, wherein the integrated circuit has at least a first module having instantiations of one or more cells, the method for designing comprising the step of:

extracting parasitic data representative of the module in a hierarchical manner from a trial layout of the integrated circuit; wherein the step of extracting comprises the steps of:

extracting first intracellular parasitic data representative of a first cell only once, regardless of the number of times the first cell is instantiated in the integrated circuit;

cutting out a first portion of intercell signal lines that are routed over a first instance of the first cell by specifying a first area in the trial layout corresponding to the first instance of the first cell such that the first portion of intercell signal lines within the first area can be processed apart from a remaining portion of the intercell signal lines;

extracting over the cell routing (OCR) parasitic data of the first portion of intercell signal lines with reference to the first instance of the first cell;

cutting out a second portion of intercell signal lines that are routed over a second instance of the first cell by specifying a second area in the trial layout corresponding to the first instance of the second cell such that the second portion of intercell lines within the second area can be processed apart from a remaining portion of the intercell signal lines; and extracting OCR parasitic data of the second portion of intercell signal lines with reference to the second instance of the first cell.

2. The method of claim 1, wherein the step of cutting out a first portion of intercell signal lines and the step of cutting out a second portion of intercell signal lines both specify an area having the same size and same shape.

3. The design method of claim 1, further comprising the steps of:
   combining the first intracellular parasitic data and the first OCR parasitic data to form a first coupled simulation model of the first instance of the first cell;
   combining the first intracellular parasitic data and the second OCR parasitic data to form a second coupled simulation model of the second instance of the first cell; and
   simulating the operation of at least the first module by using at least the first coupled simulation model of the first instance of the first cell and the second coupled simulation model of the second instance of the first cell to determine an amount of noise induced on intracell signal lines within the first instance of the first cell by intercell signal lines that are routed over the first instance of the first cell.

4. The design method of claim 3, further comprising the step of simulating the operation of at least the first module to determine an amount of noise induced on intercell signal lines that are routed over the first instance of the first cell by intracell signal lines within at least the first instance of the first cell.

5. The design method of claim 4, further comprising the step of modifying the trial layout if the amount of noise induced on any of the intercell signal lines or intracell signal lines exceeds a selected value.

6. The design method of claim 5, further comprising the step of fabricating the integrated circuit according to the modified trial layout.

7. A computer system, comprising:
   a processor for processing instructions;
   a memory circuit for holding instructions connected to the processor;
   a mass storage device for holding a design program operable to transfer the design program to the memory circuit;
   wherein the design program on the mass storage device comprises instructions for a method for extracting parasitic data from an integrated circuit design, the method comprising the steps of:
   extracting first intracellular parasitic data representative of a first cell only once, regardless of the number of times the first cell is instantiated in the integrated circuit;
   cutting out a first portion of intercell signal lines that are routed over a first instance of the first cell by specifying a first area in the trial layout corresponding to the first instance of the first cell such that the first portion of intercell signal lines within the first area can be processed apart from a remaining portion of the intercell signal lines;
   extracting over the cell routing (OCR) parasitic data of the first portion of intercell signal lines with reference to the first instance of the first cell;
   cutting out a second portion of intercell signal lines that are routed over a second instance of the first cell by specifying a second area in the trial layout corresponding to the first instance of the second cell such that the second portion of intercell lines within the second area can be processed apart from a remaining portion of the intercell signal lines; and
   extracting OCR parasitic data of the second portion of intercell signal lines with reference to the second instance of the first cell.

8. A mass storage device for holding a computer program, wherein the computer program on the mass storage device comprises instructions for a method for extracting parasitic data from an integrated circuit design, the method comprising the steps of:
   extracting first intracellular parasitic data representative of a first cell only once, regardless of the number of times the first cell is instantiated in the integrated circuit;
   cutting out a first portion of intercell signal lines that are routed over a first instance of the first cell by specifying a first area in the trial layout corresponding to the first instance of the first cell such that the first portion of intercell signal lines within the first area can be processed apart from a remaining portion of the intercell signal lines;
   extracting over the cell routing (OCR) parasitic data of the first portion of intercell signal lines with reference to the first instance of the first cell;
   cutting out a second portion of intercell signal lines that are routed over a second instance of the first cell by specifying a second area in the trial layout corresponding to the first instance of the second cell such that the second portion of intercell lines within the second area can be processed apart from a remaining portion of the intercell signal lines; and
   extracting OCR parasitic data of the second portion of intercell signal lines with reference to the second instance of the first cell.

9. The mass storage device of claim 8, wherein the mass storage device is a diskette.

* * * * *